United States Patent
Hauck

(10) Patent No.: US 8,755,243 B2
(45) Date of Patent: *Jun. 17, 2014

(54) CAPACITOR CHARGE BALANCE SYSTEM

(75) Inventor: Lane Hauck, San Diego, CA (US)

(73) Assignee: AgigA Tech Inc., San Diego, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 13/445,353

(22) Filed: Apr. 12, 2012

(65) Prior Publication Data

US 2012/0224446 A1   Sep. 6, 2012

Related U.S. Application Data

(63) Continuation of application No. 13/037,621, filed on Mar. 1, 2011, now Pat. No. 8,638,634.

(51) Int. Cl.
*G11C 5/14* (2006.01)

(52) U.S. Cl.
USPC ........... 365/229; 365/226; 365/227; 365/228

(58) Field of Classification Search
CPC .............. G11C 5/14; G11C 7/12; G11C 8/08; G11C 5/147; G11C 11/1697; G11C 11/2297
USPC .................. 365/226, 227, 228, 229
See application file for complete search history.

(56) References Cited

U.S. PATENT DOCUMENTS

| | | | | |
|---|---|---|---|---|
| 4,965,828 A | * | 10/1990 | Ergott et al. | 713/193 |
| 7,592,775 B2 | * | 9/2009 | Altemose et al. | 320/128 |
| 2010/0329064 A1 | * | 12/2010 | Wilson | 365/229 |

OTHER PUBLICATIONS

Super Capacitor Manager, Jan. 2011—Revised Mar. 2011.*
Texas Instruments, *Super Capacitor Manager*, SLUS987A, Jan. 2011 (Revised Mar. 2011).

* cited by examiner

*Primary Examiner* — Thao H Bui
(74) *Attorney, Agent, or Firm* — FSP LLC

(57) ABSTRACT

A method of managing the charge stored by a series arrangement of capacitor stages, each stage including a single capacitor or a plurality of capacitors in parallel, involves supplying each capacitor stage with charge current via a common charging terminal; separately measuring a stored potential of each capacitor stage in the series arrangement; selectively removing a controlled amount of charge from each of the capacitor stages individually) while the series arrangement is receiving the charge current from the common charging terminal; and maintaining each capacitor stage at a substantially equal stored potential.

21 Claims, 8 Drawing Sheets

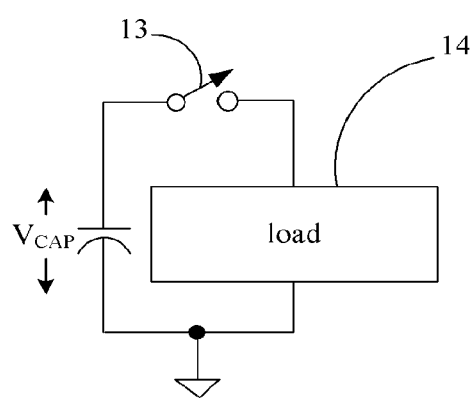
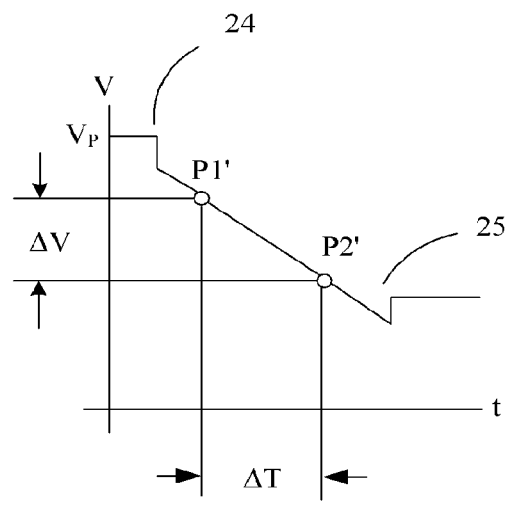
FIG. 3a
FIG. 3b

CAPACITOR CHARGE BALANCE SYSTEM

This application claims priority under 35 U.S.C. 120 as a CONTINUATION of co-pending U.S. application Ser. No. 13/037,621 filed on Mar. 1, 2011.

BACKGROUND

Many electronic systems require protection from unexpected interruption of power. These systems typically employ batteries as a source of backup power, but batteries have certain disadvantages. These disadvantages include long charge time and limited recharge cycles. If the backup power is required for only a short time, a power source may be constructed using capacitors, such as Electrochemical Dual-Layer Capacitors, often named "Ultracapacitors" or "Supercapacitors". These capacitors employ electrostatic charge separation instead of the chemical reaction which is the basis for battery operation. This gives Ultracapacitors very high (500,000+) charge cycles, quick charge times, and the ability to deliver substantial power in a small volume.

BRIEF DESCRIPTION OF THE DRAWINGS

FIGS. 3A and 3B illustrate an embodiment of a capacitance measurement during the decreasing phase of a capacitor potential that is transiently elevated over a upper predetermined operating potential for the capacitor.

DETAILED DESCRIPTION

Preliminaries

Figure 1:
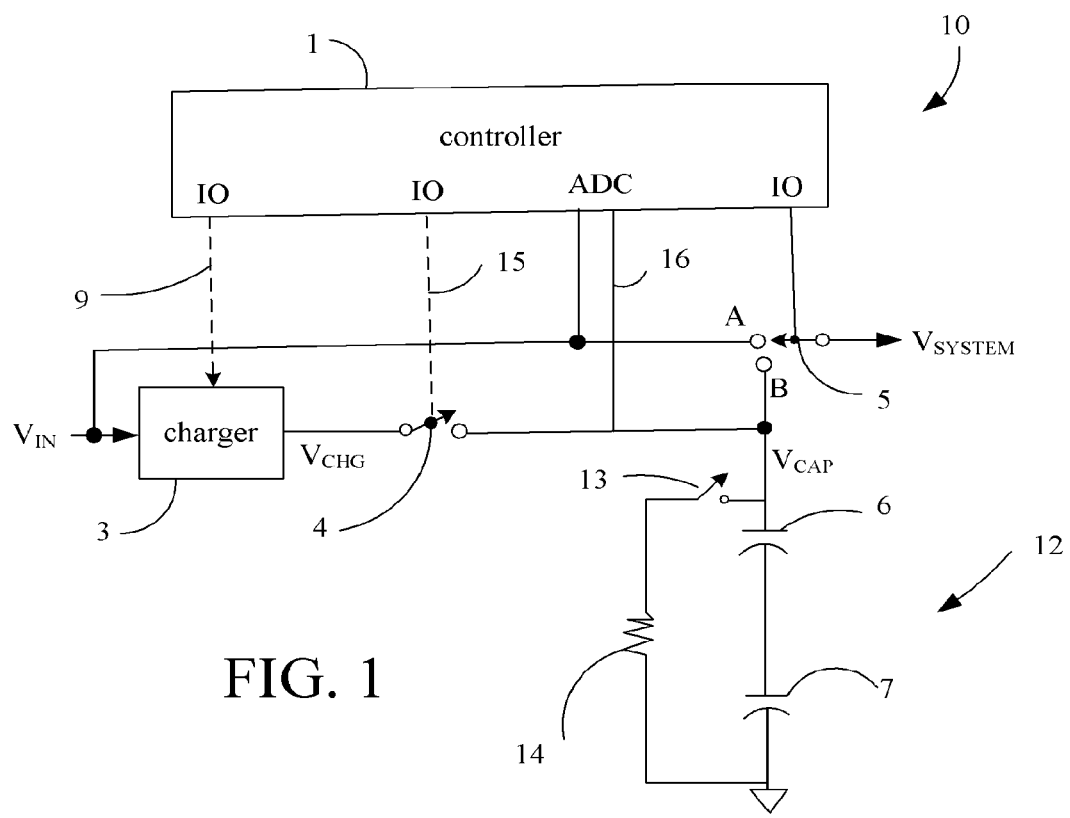
FIG. 1 illustrates an embodiment of a system using capacitors to supply backup power.

References to "one embodiment" or "an embodiment" do not necessarily refer to the same embodiment, although they may.

Unless the context clearly requires otherwise, throughout the description and the claims, the words "comprise," "comprising," and the like are to be construed in an inclusive sense as opposed to an exclusive or exhaustive sense; that is to say, in the sense of "including, but not limited to." Words using the singular or plural number also include the plural or singular number respectively. Additionally, the words "herein," "above," "below" and words of similar import, when used in this application, refer to this application as a whole and not to any particular portions of this application.

"Logic" refers to machine memory circuits, tangible machine readable media, and/or circuitry which by way of its material and/or material-energy configuration comprises control and/or procedural signals, and/or settings and values, that may be applied to influence the operation of a device. Magnetic tangible media, electronic circuits, electrical and optical memory (both volatile and nonvolatile), and firmware are examples of logic.

Those skilled in the art will appreciate that logic may be distributed throughout one or more devices, and/or may be comprised of combinations memory, media, processing circuits and controllers, other circuits, and so on. Therefore, in the interest of clarity and correctness logic may not always be distinctly illustrated in drawings of devices and systems, although it is inherently present therein.

The techniques and procedures described herein may be implemented via logic distributed in one or more devices. The particular distribution and choice of logic is a design decision that will vary according to implementation.

Overview

A capacitance measurement is performed by obtaining measurements of a capacitor's output potential during a transient elevation of the capacitor's stored potential above a upper predetermined operating potential of the capacitor. The transient elevated potential is induced during availability of the capacitor as a secondary power source for an electrically powered device. Once the measurements are taken, an accelerated discharge (meaning the capacitor is discharged faster than it would normally discharge due to inherent leakage) of the capacitor may be effected until the capacitor's stored potential is equal to the upper predetermined operating potential (within tolerances of the design). An accelerated discharge may be effected by applying a resistive load across terminals of the capacitor.

In one implementation, two or more measurements of the capacitor's stored potential may be taken during an increasing phase of the capacitor's stored potential. The increasing phase begins at the capacitor's upper predetermined operating potential and continues until the capacitor's stored potential reaches a peak value (which may be less than the capacitor's maximum rated potential).

In another implementation, two or more measurements of the capacitor's stored potential may be taken during a decreasing phase of the capacitor's stored potential. The decreasing phase begins at the capacitor's peak stored potential and continues until the capacitor's stored potential reaches a value at or below its upper predetermined operating potential.

Multiple capacitors may be arranged in a series configuration. Logic may be provided to discharge each capacitor in the series configuration separately from other capacitors in the series configuration. The discharge logic may be operated for capacitive measurements as well as to balance the stored potential on each of the capacitors.

DETAILED DESCRIPTION OF PARTICULAR EMBODIMENTS

An ultracapacitor may be selected with a capacitance that accounts for a decrease that will occur over time, as a result of an expected range of operating temperatures and/or a predetermined maximum operating voltage for the ultracapacitor.

For example, if an ultracapacitor-based backup power supply is designed to supply 100 Joules (100 Watt-seconds) to power a device memory transfer apparatus, and the power supply is expected to operate at around 55° C. for around seven years, the ultracapacitors may be chosen to supply a higher energy, for example 150 Joules, to account for an expected drop in capacitance at the rated temperature over the rated service lifetime.

A system may be designed to track the capacitance of an ultracapacitor (or any capacitor) and to generate an alert when the capacitance decays to the point that the capacitor can no longer supply an adequate amount of backup power for the system. Continuing the above example, if in the sixth year of continuous operation, an ultracapacitor backup power source is measured to have a power capacity of 110 Joules, the system may trigger a service alarm to replace the capacitor. This warning allows an orderly replacement procedure without jeopardizing the reliability of the system.

The energy stored by a capacitor may be determined by measuring its capacitance and the voltage across the capacitor terminals (the output potential, which is typically the same as the stored potential). The stored energy may then be calculated as:

$$J = \frac{1}{2}CV^2$$

Where J is the stored energy in Joules,
C is the Capacitance in Farads,
V is the capacitor output potential in Volts.

FIG. 1 illustrates an embodiment of a system using capacitors to supply backup power. Depending on the implementation, other elements may be present in the system, and would be readily understood to be present by those of skill in the relevant arts, but they are omitted from the drawings for purposes of keeping the description succinct. System 10 comprises controller 1, charger 3, and a capacitor configuration 12. The capacitor configuration 12 comprises multiple capacitors 6-7 (e.g., multiple ultracapacitors coupled in series) to increase the operating voltage beyond that available from an individual capacitor (e.g., 2.5-2.7 volts for an ultracapacitor). A typical backup power supply for a digital memory device may employ 2-6 ultracapacitors in series. Each series ultracapacitor may comprise a single ultracapacitor, or multiple ultracapacitors in parallel.

For example, a series configuration of four capacitors each rated at a maximum operating potential of 2.7V would have a combined maximum potential rating of 10.8V (4*2.7V), but the upper predetermined operation potential of the combination will be lower, e.g. 8.0V.

The controller 1 directs the charger 3 to charge the capacitors 12. The controller 1 may activate and deactivate the charger 3 via switch 4 and I/O interface 15. In some implementations, the controller 1 may also direct the charger 1 via an I/O interface 9 to provide a particular charge voltage and/or charge current.

In operation, the system 10 receives primary power at $V_{IN}$, which may for example be 12V in digital memory systems. The controller 1 maintains Switch 5 in the "A" position while $V_{IN}$ is available, providing the output voltage $V_{SYSTEM}$ directly from $V_{IN}$. The capacitors are charged and available as a backup supply should $V_{IN}$ fail.

The charger 3 is operated via switch 4 to charge the capacitors 12. Switch 4, like other switch elements, is illustrated as a discrete component but may be incorporated into the charger 3 or controller 1.

After the capacitors 12 charge to their upper predetermined operating potential, the controller 1 disconnects the charger 3 by opening the switch 4. The controller 1 may measure the capacitor stored potential $V_{CAP}$ in cooperation with logic in the charger 3, and/or by receiving $V_{CAP}$ at a controller analog-to-digital (ADC) input 16. Whenever $V_{CAP}$ diminishes by a preset amount below the upper predetermined operating potential of the capacitors 12, for example by 2%, the controller 1 may re-connect the charger 3 to "top off" the capacitors 12 to their upper predetermined operating potential.

When power $V_{IN}$ fails (e.g., becomes irregular, and/or falls below a lower acceptable limit), switch 5 is set to the "B" position. This powers the output voltage $V_{SYSTEM}$ from the capacitors 12. Capacitance is measured with switch 5 in the "A" position, which allows the capacitance measurement to be done without interrupting system power $V_{SYSTEM}$. The capacitors remain available as a backup power source during the capacitive measurement, should $V_{IN}$ fail. The controller 1 may configure the charger 3 to output a particular charge voltage and/or charge current. The charger 3 may act as a "constant current source" that provides a constant amount of current even as the impedance of the capacitor changes as the stored potential rises. For example, if $V_{CAP}$ has a upper predetermined operating potential of 10V, the controller 1 might set the charger voltage at 11V and the charge current at 200 milliamps. The controller 1 may then activate the charger 3 and measure at least two points P1 and P2 on an increasing phase of the capacitors' 12 stored potential (e.g., see FIG. 2A and FIG. 2B). After the measurements, the controller 1 may deactivate the charger 3 and close switch 13 to discharge the capacitors 12 through load 14 to their upper predetermined operating potential, for example 10V. Once the capacitors 12 are restored to their upper predetermined operating potential, controller 1 may "top off" the capacitors as stored potential leaks away, as described previously.

In some implementations (e.g. FIGS. 3a and 3b), the controller 1 may increase the stored potential $V_{CAP}$ to a peak value, set switch 13 to discharge the capacitors 12 back to $V_{CAP}$ through load 14, and measure at least two points P1' and P2' on a decreasing potential phase for the capacitors 12. Measuring capacitance on the decreasing potential phase requires a constant current load to produce a linear discharge ramp (a resistor provides an exponential discharge). Thus, the load 14 may be a simple resistor (in which case the discharge curve is nonlinear), or it may be a constant-current load, or a load which is not purely resistive in nature. A constant-current load causes a linear decrease in stored potential over time.

Timer logic (e.g., of the controller 1) may determine a time difference ΔT between P1 and P2. The controller 1 may digitize $V_{CAP}$ at P1 and P2 and subtract the digital values to determine ΔV. The capacitance may be determined (e.g., by controller 1) using the relationship:

$$C = I * \frac{\Delta T}{\Delta V}$$

I is the discharge current in Amperes,
C is the capacitance in Farads,
ΔT is the time interval in seconds, and
ΔV is the potential drop in volts during ΔT.

Figure 2A:
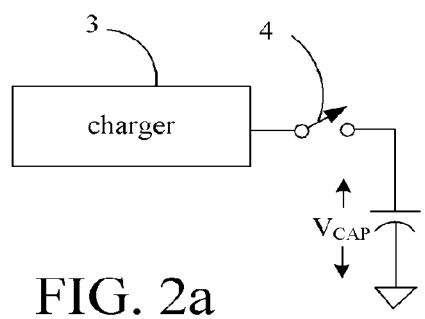
FIGS. 2A and 2B illustrate an embodiment of a capacitance measurement during the rising phase of a capacitor potential that is transiently elevated over a upper predetermined operating potential for the capacitor.
Figure 2B:
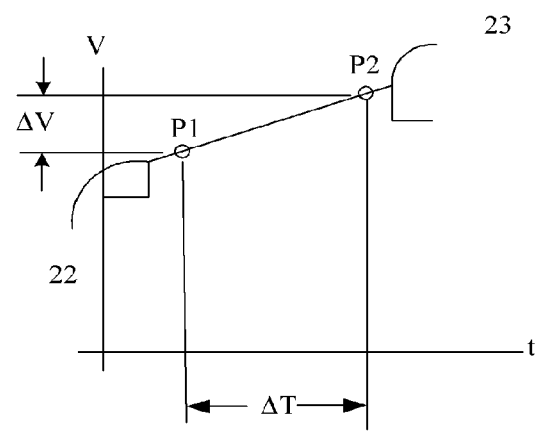

FIGS. 2A and 2B illustrate an embodiment of a capacitance measurement during the rising phase of a capacitor potential that is transiently elevated over a maximum operating voltage for the capacitor. To initiate a measurement the controller closes switch 4, connecting the charger 3 and causing a sudden potential rise 22 due to the capacitor ESR (Effective Series Resistance). The capacitor(s) charge at a linear rate and the controller may measure the two (or more) data points P1 and P2 to determine capacitance. When the measurements are complete the controller disconnects (or turns off) the charger 3, causing a sudden potential drop 23 at which point the capacitor stored potential stabilizes (except for small leakage currents which may be neglected for purposes of these discussions).

FIGS. 3A and 3B illustrate an embodiment of a capacitance measurement during the decreasing phase of a capacitor potential that is transiently elevated over a maximum operating voltage for the capacitor. The controller closes switch 13, connecting the capacitor to a load (e.g., a constant current load 14) and causing a voltage drop 24 due to the capacitor ESR. The capacitor(s) discharge at a linear rate from a peak potential $V_p$. Two (or more) data points P1' and P2' are measured to determine capacitance. The controller opens switch 13, causing a voltage jump 25. The capacitors' stored potential stabilizes at their upper predetermined operating potential.

The transient potential elevation above the upper predetermined operating potential may be set to fall below a maximum operating potential of the capacitors. This may be achieved by setting the upper predetermined operating potential of the capacitors below a maximum operating potential for the capacitors. A peak potential reached during the transient elevation in potential may reach the maximum operating potential or may not reach this maximum level. The transient voltage elevation and accompanying measurements may be applied for a time period that is very small in proportion to the overall operating time of the capacitors. For example, capacitance measurements may be made once per week. If a capacitance measurement requires transiently elevating the capacitor potential by 100 millivolts for 1 minute, the percentage of time spent above the upper predetermined operating potential is only about 0.01% (1 minute/10,080 minutes per week). This results in a net operating lifetime loss of 0.005% for the capacitor, an acceptably low amount. In one embodiment, the capacitor stored potential may be elevated above its upper predetermined operating potential less than 0.1% of its operating lifetime. In some designs, the capacitor stored potential may be elevated above its upper predetermined operating potential less than 0.05% of its operating lifetime.

The controller 1 monitors $V_{IN}$. If $V_{IN}$ fails during a capacitance measurement, the controller 1 discontinues the capacitance measurement and moves switch 5 to the "B" position. The capacitors 6-7 then supply system power at an output potential $V_{SYSTEM}$ that temporarily exceeds their upper predetermined operating potential. After Vin fails, the capacitors 6-7 continue to provide current even as their potential drops. One or more voltage regulators may accept the decreasing capacitor output potential and in response provide discrete potential levels to the system. For example as the capacitors' output potential continuously decreases from 10V to 4V, one or more regulators may provide 3.3V, 2.5V, 1.8V and 1.5V.

Figure 4:
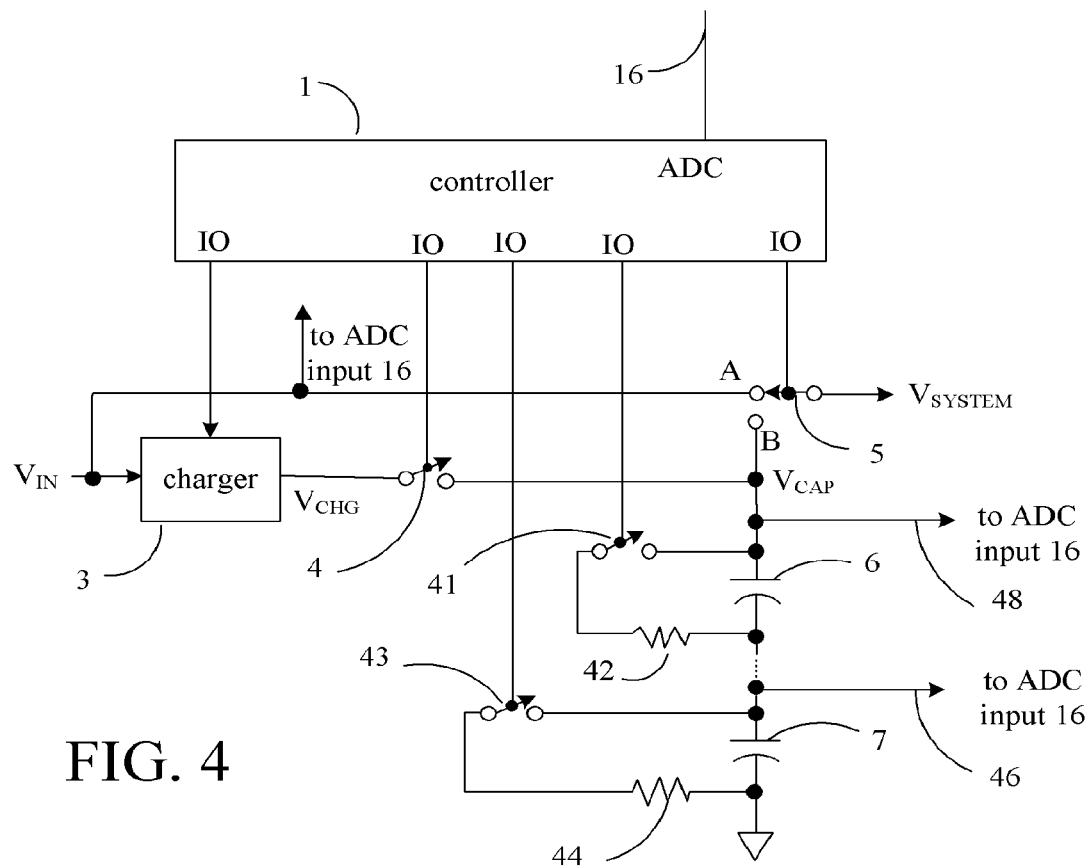
FIG. 4 illustrates an embodiment of a backup power source including logic to drain charge from individual capacitors.

FIG. 4 illustrates an embodiment of a backup power source including logic to individually discharge capacitors in a series arrangement. Discharge logic (41-42 and 43-44) is coupled to each capacitor 6-7 in a series arrangement. There may be more than two capacitors in series and each series capacitor may comprise two or more capacitors in parallel, with each parallel set in the series be associated with its own discharge logic. The controller 1 measures the stored potential of each capacitor 6-7 via interfaces 48 and 46. Not illustrated are scaling resistors that may reduce stored capacitor potentials to a range compatible with the controller ADC input 16, for example 3.3V maximum.

This arrangement or a similar one allows each capacitor 6-7 to be set to an individual operating potential even if the capacitance values of the capacitors in the series arrangement are mismatched (not the same). The ability to selectively discharge individual capacitors in a series may be also invoked during charging operations to maintain the capacitor stored potentials in balance (i.e., keep them substantially equal within tolerances of the implementation).

A mismatched series of capacitors (e.g., a series coupled string of capacitors) is vulnerable to "over-voltage" (a stored potential in excess of the capacitor's design limits) during charging with large currents, because lower value capacitors charge faster than higher value ones. All capacitors in a series configuration receive the same charge current (parallel capacitors split the provided charge current). Lower-capacitance capacitors reach a target stored potential (e.g., their upper predetermined operating potential) before higher-capacitance capacitors reach the same target potential. Charging higher-capacitance capacitors in a series configuration to a combined upper predetermined operating potential for the combination, may result in the lower-capacitance capacitors being individually over-charged (charged above their individual upper predetermined operating potential). To mitigate this effect, the individual capacitor discharge logic (41-42 and 43-44) may be employed to "balance" the capacitors' stored potential as they are charged.

The controller 1 may monitor each individual capacitor output potential during charging of the series configuration of capacitors 6-7. The controller 1 may determine which (if any) capacitors are approaching an unsafe (over-voltage) condition, and transiently switch on the discharge logic for at-risk capacitors to drain charge away from (and thus lower the stored potential of) these capacitor(s). By way of example, the discharge logic may comprise a MOSFET transistor in series with a resistor, or it may be only a MOSFET that is duty-cycle modulated by the controller 1 to time-average the discharge current.

The discharge logic may therefore function to (1) discharge the capacitors 6-7 after the capacitor stored potential is transiently elevated for a capacitance measurements, (2) balance the capacitors' stored charge during high-current charging to prevent an over-voltage condition, and (3) balance the capacitors' stored charge when differences in leakage currents result in mismatched stored potential for different capacitors.

Figure 5:
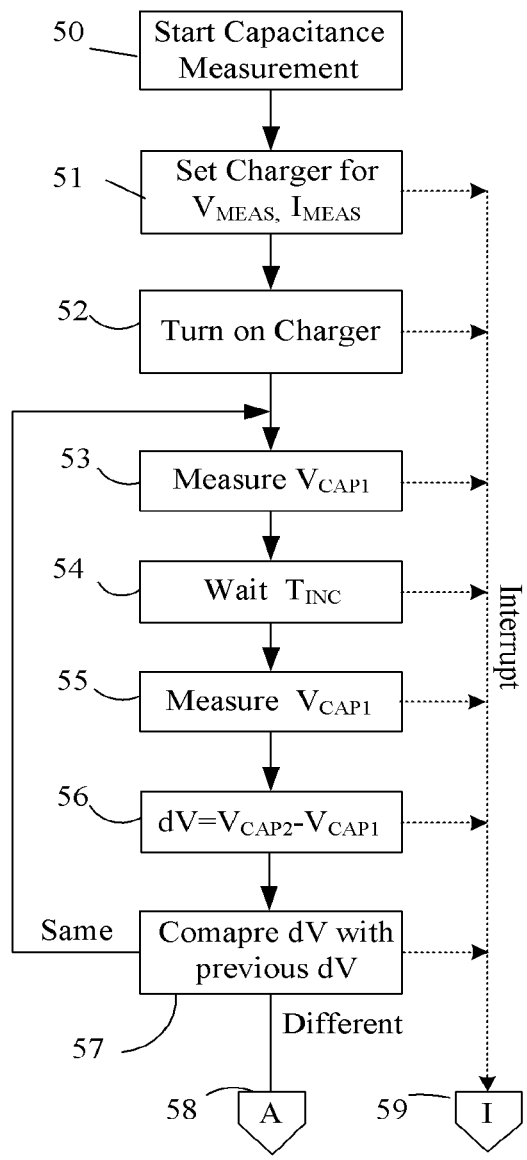
FIGS. 5-7 are flowcharts that illustrate an embodiment of a capacitance measurement during operation of a backup power supply.
Figure 6:
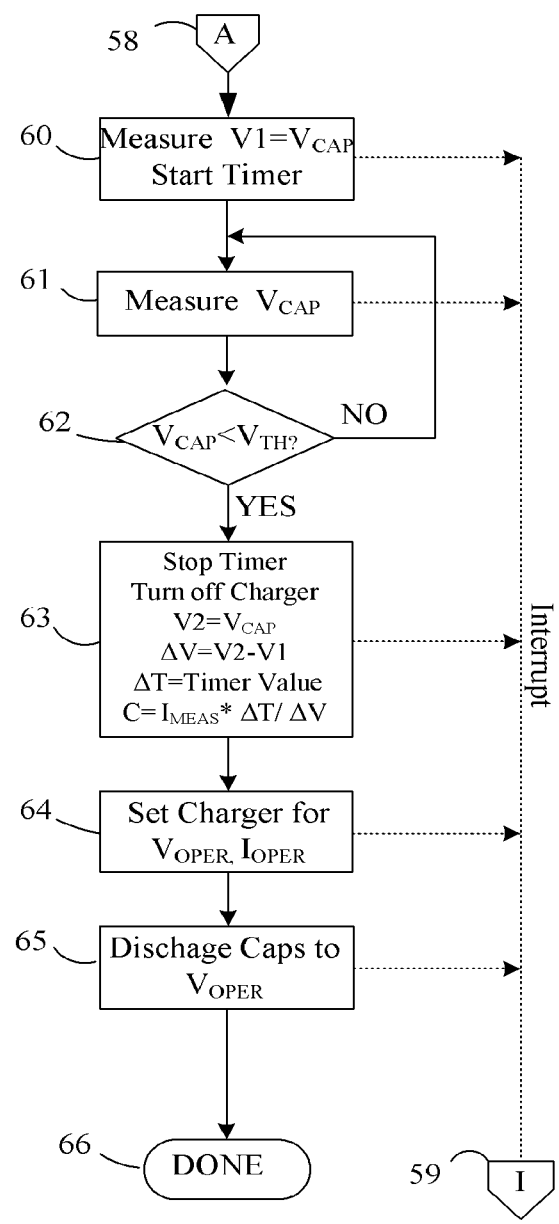
Figure 7:
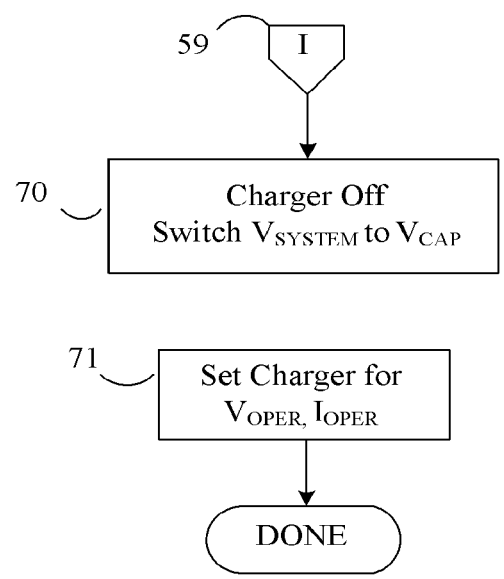

FIGS. 5-7 are flowcharts that illustrate an embodiment of a capacitance measurement during operation of a backup power supply. A capacitance measurement is initiated (50), either by the host system, or from a scheduled timer, for example once per week and during availability of the capacitors to provide backup power to the system in the event of primary power failure. The charger is set to a voltage and current level ($V_{MEAS}$ and $I_{MEAS}$, measurement charge voltage and measurement charge current) compatible with the capacitance measurement requirements (51). Prior to (50), the charger may be set to different voltage and current values for the purpose of maintaining the capacitors at their upper predetermined operating potential. The values of the charger voltage and current for maintaining the capacitors at their upper predetermined operating potential are herein referred to as $V_{OPER}$ voltage) and $I_{OPER}$ (current).

The controller activates the charger (52) to cause the capacitor stored potential to increase upward beyond the capacitor's upper predetermined operating potential. At (53-57), the controller monitors for a transition from the sudden potential jump (e.g., jump 22 in FIG. 2B) to the linear ramping stored potential. At (53-55) the controller measures the slope of the capacitor potential increase by taking two (or more) voltage measurements over a reference time increment $T_{INC}$ (for example once every 10 milliseconds). The controller determines the difference in voltages over the reference time (56) and compares with the stored difference from a previous measurement. If the time interval between samples is constant, the voltage difference is a direct indication of the slope of the charge curve. The measurement loop continues until the present slope value is substantially changed from the previous one, indicating the onset of the linear charge phase.

For example, five consecutive voltage measurements and their computed ΔV values might be taken at 10 millisecond intervals as shown in the table below:

| Time  | V$_{CAP}$ | ΔV     |
|-------|-----------|--------|
| 0     | 10.00     |        |
| 10 ms | 10.10     | 100 mV |
| 20 ms | 10.20     | 100 mV |
| 30 ms | 10.22     | 20 mV  |
| 40 ms | 10.24     | 20 mV  |

At the 30 millisecond measurement the slope has reduced from 10 millivolts per millisecond to 2 millivolts per millisecond, indicating the onset of the linear charging ramp. At this point the controller may proceed (68) to the capacitance measurement ([A], FIG. 6).

The dotted path in FIG. 5 indicates that the controller may receive an interrupt signal indicating that primary power for the system is lost. This interrupt signal may assert at any time, and it overrides the capacitance measurement process to cause an alternate action as described in FIG. 7.

The exemplary process described in FIG. 5 may be readily adapted to detect the linear discharge phase depicted in FIG. 3B.

In FIG. 6 the controller may measure the two data points P1 and P2 as shown in FIG. 2A. At (60) the controller measures V$_{CAP}$ and assigns it to variable V1. The controller starts a timer to measure the time interval between measuring P1 and P2. After the controller detects a preset potential rise V$_{TH}$ (62), it proceeds (63) to measure the second data point P2. Instead of setting a reference potential, the controller may alternately set a reference time and take the measurement P2 after this time elapses.

At (62) the controller stops its timer, turns off the charger, and measures a second V$_{CAP}$, assigning it to variable V2. The controller subtracts V1 from V2 to arrive at ΔV. The controller calculates the capacitance as $$C = I_{MEAS} * \frac{\Delta T}{\Delta V}$$

At (64) the controller returns the charger settings to values for 'topping off' the capacitor during system operation. At (65) the controller discharges the capacitors to their upper predetermined operating potential and the measurement is complete. Any measurement may be interrupted by loss of primary system power, leading to the Interrupt Service Routine (59).

In an alternative embodiment, the exemplary process described in FIG. 6 may be readily adapted to take measurement points P1' and P2' as depicted in FIG. 3B.

FIG. 7 illustrates an interrupt service routine, entered upon a loss of primary system power, i.e. V$_{IN}$ drops below an acceptable value or otherwise becomes unreliable/unstable. At (70) the interrupt service routine causes the controller to turn off the charger and connect the backup capacitor power source to V$_{SYSTEM}$. At (71) the controller sets the charger to charge the capacitor to its upper predetermined operating potential, and the measurement process is complete.

Figure 8:
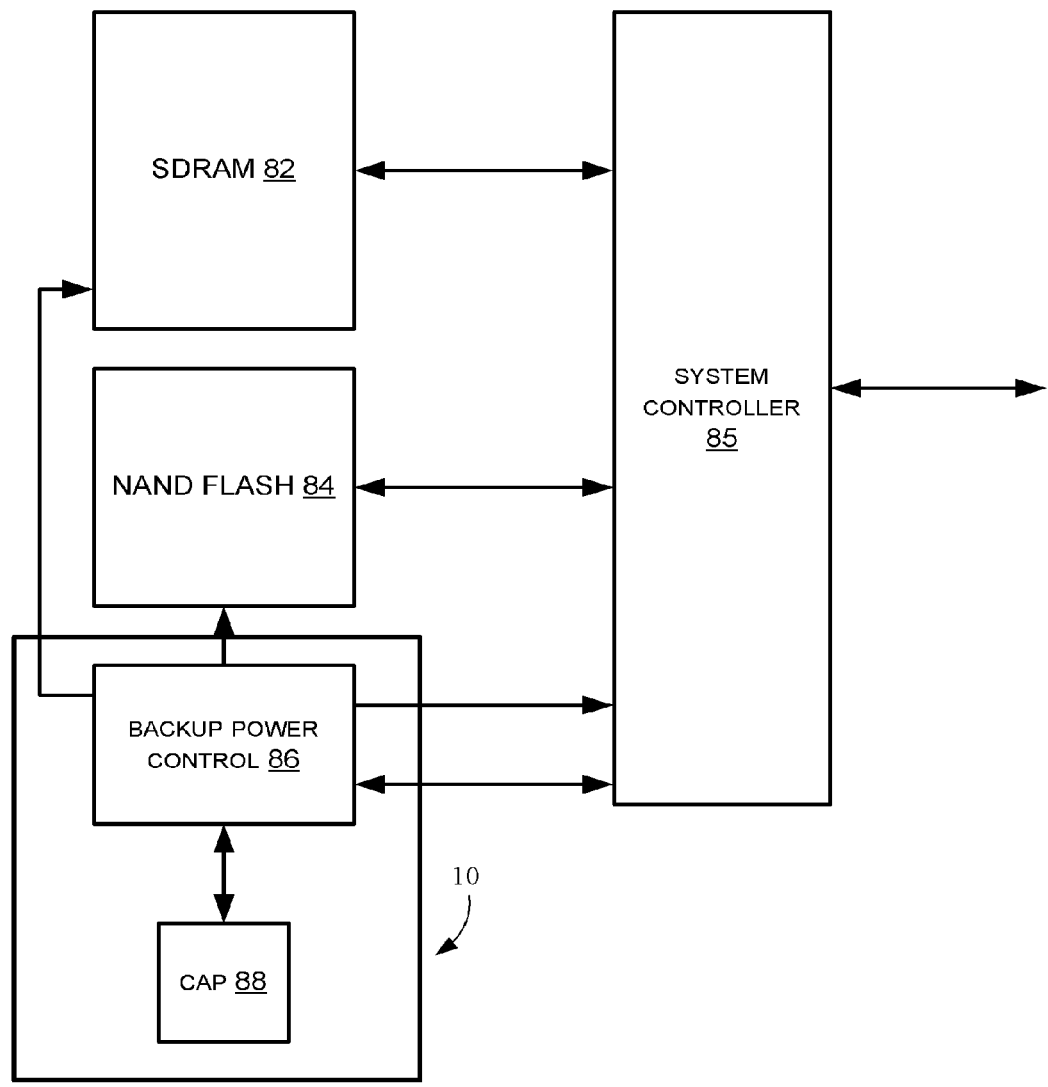
FIG. 8 illustrates an embodiment of a memory system employing a capacitor-based backup power source.

FIG. 8 illustrates a memory system utilizing a capacitor-based backup power supply. The system provides a low-cost, high density, non-volatile memory by using a low-cost volatile memory 82 in conjunction with a low-cost non-volatile memory 84. The memory subsystem includes, but may not be limited to, SDRAM 82 (volatile memory), NAND FLASH 84 (nonvolatile memory), backup power control circuitry 86, power capacitor(s) 88, and a system controller 85. Other elements and/or couplings among the elements may be apparent to skilled practitioners in the relevant art(s).

The volatile memory in this embodiment is an SDRAM 82 (Synchronous Dynamic Random Access Memory). Other types of volatile random access memory may also be used. The nonvolatile memory in this embodiment is a NAND FLASH 84, and again, other types of nonvolatile memory may be used.

The power control circuitry 86 interfaces the memory subsystem to an external power source, typically the power source of a larger system that incorporates and uses the memory subsystem. For example, the external power source may be the power of personal or business computer system that incorporates the memory subsystem. The power control circuitry 86 also interfaces the memory subsystem to a backup power source that is local to the memory subsystem. The backup power source may be, for example, one or more capacitors 88. In the embodiment of FIG. 8, capacitor(s) 88 provides power to the memory subsystem for a temporary time when external power fails. The capacitor 88 may provide power for long enough to copy data blocks from volatile memory 82 to nonvolatile memory 84.

In the event of an external power failure, the memory subsystem may operate as an isolated subsystem of the larger, external system. The power circuitry 86 may recognize that external system power has failed. The system controller 85 may then initiate backup of data currently stored in the volatile memory 82 into the non-volatile memory 84. Herein, the term "backup" means that data of the volatile memory 82 is stored into the nonvolatile memory 84. Upon restoration of external system power, the system controller 85 may initiate restoration of backed-up data from non-volatile memory 84 to volatile memory 82. Herein, the term "restore" and "restoration" means that data of the nonvolatile memory 84 is stored into the volatile memory 82.

The system controller 85 may thus include logic to backup data from volatile memory 82 to nonvolatile memory 84 when the external power source fails, and to restore data from nonvolatile memory 84 to volatile memory 82 when the external power source becomes available. Those skilled in the art will appreciate that various functional components, such as the power controller logic 86 and the system controller logic 85, and even the volatile memory 82 and nonvolatile memory 84, may in fact be implemented together as one or more integrated circuit devices, and packaged as one or more discrete physical components.

Data stored within the memory subsystem persists even when the power of the external system fails. The external system may interact with the memory subsystem as though interacting with volatile memory 82 (of the same or another type), even though, transparently, the data is stored internally by the memory subsystem in nonvolatile memory 84 persistently in the absence of external system power.

The memory system may write data to non-volatile memory 84 only in the event that external system power fails. Thus, the non-volatile memory 84 undergoes many fewer write cycles than would occur if it were being written every time data were written to the memory subsystem. When the non-volatile memory 84 is a low-cost, limited duty cycle NAND FLASH, the result in an extension of the useful lifetime of the non-volatile memory 84.

The system controller 85 provides a memory interface to the external system. The memory interface may comprise a standard data and control interface for some particular kind of volatile memory. For example, the system controller may provide an SDRAM data, address, and control interface to the external system. The interface provided to the external system may or may not be the interface for the type of volatile memory 82 actually used by the memory subsystem.

The system controller 85 may additionally provide an interface whereby the external system may send commands to the memory subsystem or obtain status. For example, in some embodiments the external system may command the memory subsystem to initiate a backup of data from volatile memory 82 to non-volatile memory 84, even though the system power is still available. Additionally or alternatively, the memory subsystem or external system may provide a direct user interface, such as a switch or control on a graphic user interface, whereby a user of the external system may directly initiate a copy of data from volatile 82 to non-volatile memory 84. Another action which may in some embodiments be initiated either through the system interface of the system controller 85, or directly by a user, is restoring data from non-volatile memory 84 to volatile memory 82. In some embodiments the external system may use its system interface to the memory controller 85 to initiate a self test of the memory subsystem.

Other examples and/or embodiments of the various system components may now be apparent to skilled practitioners in the relevant art(s).

Implementations and Alternatives

Those having skill in the art will appreciate that there are various logic implementations by which processes and/or systems described herein can be effected (e.g., hardware, software, and/or firmware), and that the preferred vehicle will vary with the context in which the processes are deployed. "Software" refers to logic that may be readily readapted to different purposes (e.g. read/write volatile or nonvolatile memory or media). "Firmware" refers to logic embodied as read-only memories and/or media. Hardware refers to logic embodied as analog and/or digital circuits. If an implementer determines that speed and accuracy are paramount, the implementer may opt for a hardware and/or firmware vehicle; alternatively, if flexibility is paramount, the implementer may opt for a solely software implementation; or, yet again alternatively, the implementer may opt for some combination of hardware, software, and/or firmware. Hence, there are several possible vehicles by which the processes described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations may involve optically-oriented hardware, software, and or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof. Several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in standard integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and/or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies equally regardless of the particular type of signal bearing media used to actually carry out the distribution. Examples of a signal bearing media include, but are not limited to, the following: recordable type media such as floppy disks, hard disk drives, CD ROMs, digital tape, and computer memory.

In a general sense, those skilled in the art will recognize that the various aspects described herein which can be implemented, individually and/or collectively, by a wide range of hardware, software, firmware, or any combination thereof can be viewed as being composed of various types of "circuitry." Consequently, as used herein "circuitry" includes, but is not limited to, electrical circuitry having at least one discrete electrical circuit, electrical circuitry having at least one integrated circuit, electrical circuitry having at least one application specific integrated circuit, circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), circuitry forming a memory device (e.g., forms of random access memory), and/or circuitry forming a communications device (e.g., a modem, communications switch, or optical-electrical equipment).

Those skilled in the art will recognize that it is common within the art to describe devices and/or processes in the fashion set forth herein, and thereafter use standard engineering practices to integrate such described devices and/or processes into larger systems. That is, at least a portion of the devices and/or processes described herein can be integrated into a network processing system via a reasonable amount of experimentation.

The foregoing described aspects depict different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality.

What is claimed is:

1. A circuit, comprising:
a series arrangement of two or more capacitor stages, each stage comprising a single capacitor or a plurality of capacitors in parallel, the series arrangement configured such that each capacitor stage is supplied with charge current via a common charging terminal;

a controller configured to separately measure a stored potential of each capacitor stage in the series arrangement;

nontransitory logic to selectively remove a controlled amount of charge from each of the capacitor stages individually (discharge logic); and nontransitory logic to operate the discharge logic to maintain each capacitor stage at a substantially equal stored potential (balancing logic) while the series arrangement is receiving the charge current from the common charging terminal.

2. The circuit of claim 1, wherein at least one first capacitor stage of the series arrangement has a capacitance mismatched from a capacitance of a second capacitor stage of the series arrangement.

3. The circuit of claim 1, the controller configured to operate the discharge logic to discharge at least one of the capacitor stages concurrently with charging the series arrangement of capacitor stages.

4. The circuit of claim 3, the controller configured to detect an overcharge of one or more of the capacitor stages, and to operate the discharge logic to discharge the one or more capacitor stages that overcharge, while concurrently charging the series arrangement of capacitor stages.

5. The circuit of claim 1, wherein the discharge logic comprises, for each capacitor stage, a switch in series with a resistance.

6. The circuit of claim 1, wherein the discharge logic comprises, for each capacitor stage, a duty cycle modulated switch.

7. The circuit of claim 1, the controller configured to detect an imbalance in the stored potential of two or more of the capacitor stages, and to operate the discharge logic to balance the stored potential on the two or more imbalanced capacitor stages.

8. A memory module, comprising:
a volatile memory;
a nonvolatile memory;
a series arrangement of two or more capacitor stages, each stage comprising a single capacitor or a plurality of capacitors in parallel, the series arrangement configured such that each capacitor stage is supplied with charge current via a common charging terminal;
a controller configured to separately measure a stored potential of each capacitor stage in the series arrangement;
nontransitory logic to selectively remove a controlled amount of charge from each of the capacitor stages individually (discharge logic);
nontransitory logic to operate the discharge logic to maintain each capacitor stage at a substantially equal stored potential (balancing logic) while the series arrangement is receiving the charge current from the common charging terminal; and
nontransitory logic to apply power from the series arrangement of capacitors to backup data from the volatile memory to the nonvolatile memory upon a failure of primary power to the memory module.

9. The memory module of claim 8, wherein at least one first capacitor stage of the series arrangement has a capacitance mismatched from a capacitance of a second capacitor stage of the series arrangement.

10. The memory module of claim 8, the controller configured to operate the discharge logic to discharge at least one of the capacitor stages concurrently with charging the series arrangement of capacitor stages.

11. The memory module of claim 10, the controller configured to detect an overcharge of one or more of the capacitor stages, and to operate the discharge logic to discharge the one or more capacitor stages that overcharge, while concurrently charging the series arrangement of capacitor stages.

12. The memory module of claim 8, wherein the discharge logic comprises, for each capacitor stage, a switch in series with a resistance.

13. The memory module of claim 8, wherein the discharge logic comprises, for each capacitor stage, a duty cycle modulated switch.

14. The memory module of claim 8, the controller configured to detect an imbalance in the stored potential of two or more of the capacitor stages, and to operate the discharge logic to balance the stored potential on the two or more imbalanced capacitor stages.

15. A method of managing the charge stored by a series arrangement of capacitor stages, each stage comprising a single capacitor or a plurality of capacitors in parallel, the method comprising:
supplying each capacitor stage with charge current via a common charging terminal;
separately measuring a stored potential of each capacitor stage in the series arrangement;
selectively removing a controlled amount of charge from each of the capacitor stages individually while the series arrangement is receiving the charge current from the common charging terminal; and
maintaining each capacitor stage at a substantially equal stored potential.

16. The method of claim 15, further comprising:
mismatching the capacitance of at least one first capacitor stage of the series arrangement from a capacitance of a second capacitor stage of the series arrangement.

17. The method of claim 15, further comprising:
discharging at least one of the capacitor stages concurrently with charging the series arrangement of capacitor stages.

18. The method of claim 17, further comprising:
detecting an overcharge of one or more of the capacitor stages, and discharging the one or more capacitor stages that overcharge, while concurrently charging the series arrangement of capacitor stages.

19. The method of claim 15, further comprising:
for each capacitor stage, operating a switch in series with a resistance to discharge the capacitor stage.

20. The method of claim 15, further comprising:
operating a duty cycle modulated switch to discharge each capacitor stage.

21. The method of claim 15, further comprising:
detecting an imbalance in the stored potential of two or more of the capacitor stages, and balancing the stored potential of the two or more imbalanced capacitor stages by discharging at least one of the two or more imbalanced capacitor stages.

* * * * *